United States Patent
Higashiyama et al.

[11] Patent Number: 5,225,793
[45] Date of Patent: Jul. 6, 1993

[54] VOLTAGE-CONTROLLED OSCILLATOR SYSTEM

[75] Inventors: Naotoshi Higashiyama, Tokyo; Fumikazu Ohkubo, Kanagawa; Tetsuo Nakamura, Saitama, all of Japan

[73] Assignees: Pioneer Electronic Corporation; NEC Corporation, Tokyo, Japan

[21] Appl. No.: 862,166

[22] Filed: Apr. 2, 1992

[30] Foreign Application Priority Data
Apr. 23, 1991 [JP] Japan ................... 3-091851

[51] Int. Cl.$^5$ ............................. H03B 5/36
[52] U.S. Cl. ................... 331/158; 331/36 C; 331/75; 331/109; 331/177 V
[58] Field of Search ............ 331/8, 36 C, 75, 109, 331/116 R, 116 FE, 117 R, 117 FE, 158, 177 V, 182, 36 R, 177 R

[56] References Cited
U.S. PATENT DOCUMENTS
3,421,111 1/1969 Boyajian ................. 331/177 V
4,750,061 6/1988 Kawasaki ................. 360/66

FOREIGN PATENT DOCUMENTS
0318320 5/1989 European Pat. Off.
63-097003 4/1988 Japan.
63-314011 12/1988 Japan.

Primary Examiner—David Mis
Attorney, Agent, or Firm—Finnegan, Henderson, Farabow, Garrett & Dunner

[57] ABSTRACT

A ceramic resonator, a variable reactance circuit, and a limiter circuit are connected to the output of an amplifier having an output that is fed back to the positive phase-sequence input, and the frequency of oscillation is controlled by varying an equivalent capacitance of the reactance circuit with a control voltage applied to the reactance circuit. The limiter circuit ensures a variable frequency range on the high frequency side, and the symmetry of the capture range when this system is applied to a PLL can be improved.

3 Claims, 2 Drawing Sheets

VOLTAGE-CONTROLLED OSCILLATOR SYSTEM

BACKGROUND OF THE INVENTION

1. Field of the Invention

The invention relates to a voltage-controlled oscillator (VCO) used in a stereo demodulator.

2. Description of the Related Art

Progress has been made in recent years to provide adjustment-free initialization of the oscillation frequency for a VCO (voltage-controlled oscillator) that plays an important role in a PLL (phase-locked loop) operation of the demodulator of an FM (frequency modulation) tuner.

A conventional VCO system that requires no adjustment is shown in FIG. 3. The system is made up of an amplifier 11, a ceramic resonator 14, and a variable reactance circuit 13. The output of the amplifier 11 is positively fed back and is also connected to the ceramic resonator 14 and the variable reactance circuit 13, so that the output of the amplifier 11 serves as the output terminal of the VCO. FIG. 4 shows an equivalent circuit of the ceramic resonator 14. Assuming that Cv is the equivalent capacitance of the variable reactance circuit; Ca is the equivalent parallel capacitance of the ceramic resonator 14; Cr is the equivalent series capacitance; L is the equivalent series inductance; and r is the equivalent series resistance, then the output terminal 12 oscillates at a frequency obtained by equation (1):

$$f_{osc} = \frac{1}{2\pi \sqrt{L\left(\frac{(Ca + Cv) \cdot Cr}{Ca + Cr + Cv}\right)}} \quad (1)$$

Thus, $f_{osc}$ (oscillation frequency) can be controlled by controlling the equivalent capacitance Cv of the variable reactance circuit. However, to initialize the VCO without adjustment, the initial oscillation frequency (with the variable reactance circuit uncontrolled) must be a parallel resonance frequency inherent in the ceramic resonator 14. For this reason, the capacitance component Cv when the variable reactance circuit 13 is not controlled is zero, while the capacitance component must be variable from a negative value to a positive value when the variable reactance circuit 13 is driven into control.

The output terminal 12 of the above-mentioned conventional system, i.e., the load at the output of the amplifier 11, consists of the variable reactance circuit 13 and the ceramic resonator 14, and a synthetic load Z is thus given by equation (2):

$$Z = \frac{1 - \omega^2 CrL + j\omega rCr}{-\omega^2 CrCxr + j\omega\{(Cr + Cx) - \omega^2 CrCxL\}} \quad (2)$$

where $Cx = Ca + Cv$

If the system is in resonance, then $\omega$ is given by equation (3):

$$\omega = \left(\frac{Cr + Cv}{LCr + Cv}\right)^{\frac{1}{2}} \quad (3)$$

From equations (2), (3), the absolute value $|Z|$ of the load at the output terminal 12 can be obtained as follows:

$$|Z| = \frac{(r^2LCrCx^2 + r^2LCr^2Cx + L^2Cr^2)^{\frac{1}{2}}}{rCx(Cx + Cr)} \quad (4)$$

It is understood from equations (1) and (4) that the oscillation level increases with increasing resonance frequency.

Since the oscillation level at the output terminal 12 is restricted by the input/output dynamics of the amplifier 11 and the variable reactance circuit 13, oscillation over such input/output dynamics is beyond control. This means that the high frequency side of desired variable oscillation frequencies cannot be varied for the VCO, and to select the desired variable frequency range, the oscillation level must be set to a small value. In other words, the amplifier 11 be designed so as to have a small output current capacity. This impairs the oscillation capacity of the VCO and thereby makes it difficult to provide a stable supply of oscillations. Further, since the equivalent capacitance Cv of the variable reactance circuit 13 changes at an equal value positively and negatively from equation (1), the variable frequency range on the high frequency side becomes wider, making the capture range of the PLL (phase-locked loop) asymmetric.

SUMMARY OF THE INVENTION

The VCO system of the invention is characterized by providing a limiter circuit (damping circuit), at an output terminal thereof, that operates at more than a set oscillation level.

Accordingly, the absolute value of a load at the output terminal is decreased, thereby ensuring not only a variable oscillation range on the high frequency side but also a symmetrical capture range of the PLL.

DESCRIPTION OF PREFERRED EMBODIMENT

Figure 1:
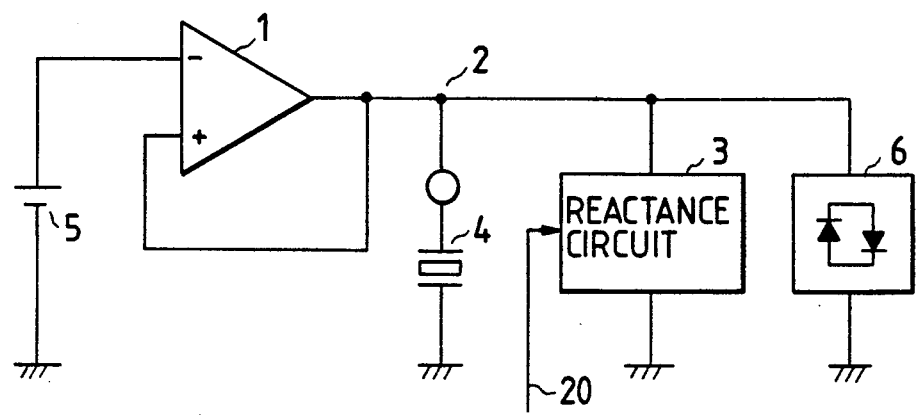
FIG. 1 is a block diagram showing a voltage-controlled oscillator (VCO) system of the invention.

An embodiment of the invention will be described in detail. FIG. 1 is a block diagram showing an embodiment of the invention. This system includes an amplifier 1, a variable reactance circuit 3, a ceramic resonator 4, and a limiter circuit 6. The output of the amplifier 1 is positively fed back. The output of the amplifier 1 is also connected to the ceramic resonator 4, the variable reactance circuit 3, and the limiter circuit 6 to serve as the output terminal of the voltage-controlled oscillator (VCO). A control voltage 20 is applied to the variable reactance circuit 3 to control the equivalent capacitance of the circuit 3. Assuming here that Cv is the equivalent capacitance of the variable reactance circuit 3, Ca is the equivalent parallel capacitance, Cr is the equivalent series capacitance, L is the equivalent series inductance, and r is the equivalent series resistance, then the output terminal 2 oscillates at a frequency given by equation (1)

as in the conventional system. The output terminal 2 of the VCO in this embodiment has the same load as that of the conventional system when the limiter circuit 6 is not in operation.

The limiter circuit 6 of the invention is operated within the input/output dynamics of the amplifier 1 and the variable reactance circuit 3. When the limiter circuit 6 is driven into operation, the absolute value of a load at the output terminal 2 is decreased by the limiter circuit 6, which then causes the oscillation level to be attenuated. As a result, a variable frequency range on the high frequency side can be ensured.

Figure 2:
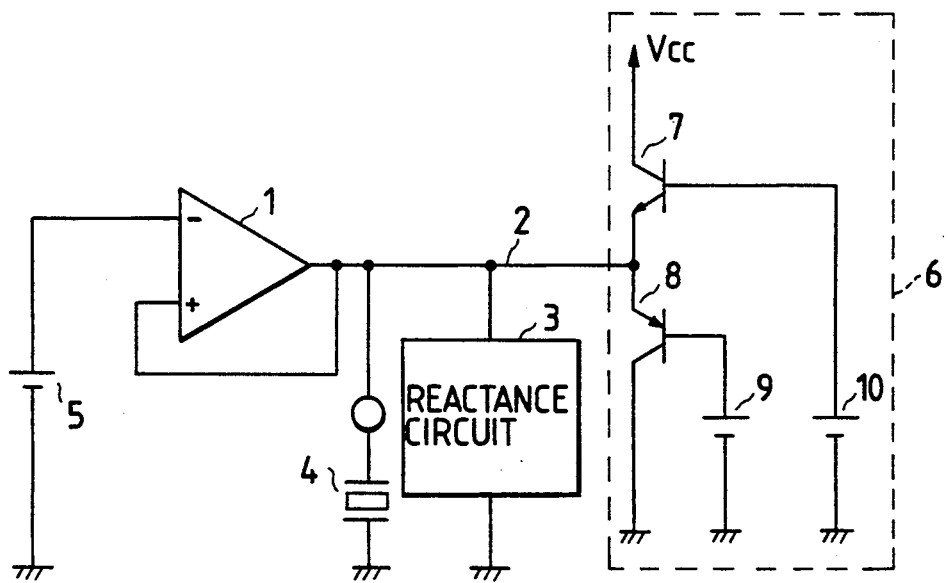
FIG. 2 is a diagram of a VCO system having a limiter circuit that is a specific example of FIG. 1.
Figure 3:
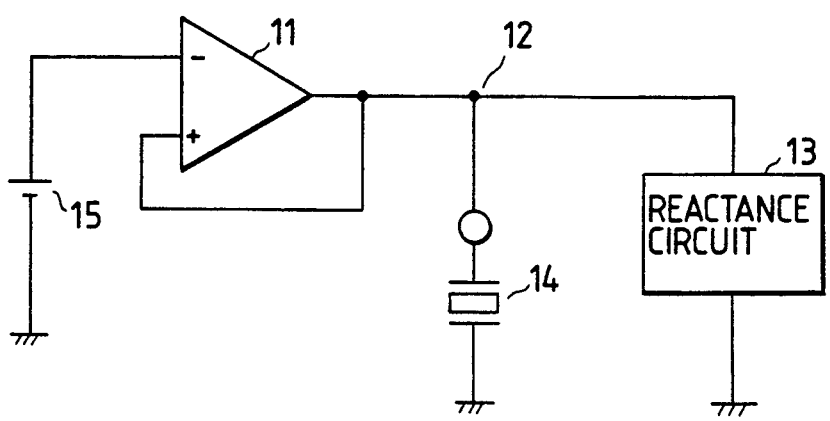
FIG. 3 is a block diagram showing a conventional example.
Figure 4:
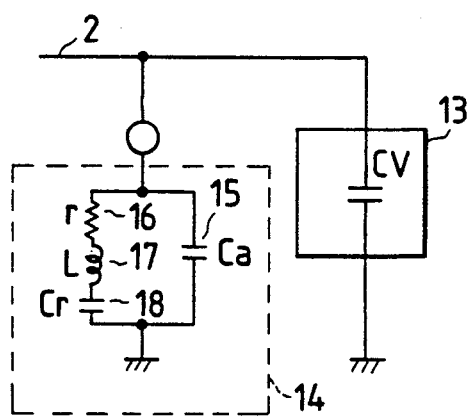
FIG. 4 is an equivalent circuit diagram of a ceramic resonator.

FIG. 2 shows an embodiment of the limiter circuit. The circuit is made up of an NPN-type transistor 7, a PNP-type transistor 8, and power supplies 9 and 10. The emitters of transistors 7 and 8 are commonly connected to the output terminal 2, while the power supply 10 is connected to the base of the transistor 7 and the power supply 9 is connected to the base of the transistor 8. Assuming here that $V_{BE7}$ is the base-emitter voltage when the transistor 7 is in operation and $V_{BE8}$ is the base-emitter voltage when the transistor 8 is in operation, and that $V_9$ and $V_{10}$ are the voltages of the power supplies 9 and 10, respectively, then an upper limiter is driven into operation when an upper-side amplitude voltage at the output terminal 2 of the invention is at $V_9+V_{BE8}$ or more, and a lower limiter is driven into operation when a lower-side amplitude is at $V_{10}-V_{BE7}$ or less. The limiting voltage can be set freely by the power supplies 9 and 10 in accordance with the input/output dynamics of the amplifier 1 and the variable reactance circuit 3.

The system of the invention allows the variable frequency range on the high frequency side to be restricted by the relation between the attenuation capability of the limiter circuit 6 and the input/output dynamics of the amplifier 1 and the variable reactance circuit 3. Since the equivalent capacitance Cv of the variable reactance circuit changes at the same value both positively and negatively in the conventional system according to equation (1), the variable frequency range on the high frequency side becomes so wide that the capture range of the PLL is made asymmetric. However, with the system of the present invention, the capture range of the PLL can be made symmetric by restricting the variable frequency range on the high frequency side by the limiter circuit 6 as described above.

As described in the foregoing pages, the VCO system of the invention provides a limiter circuit at its output terminal, whereby the variable frequency range on the high frequency side can be ensured and the capture range of the PLL can be symmetric between the high and low frequencies.

What is claimed is:

1. A voltage-controlled oscillator comprising:
a resonator;
a variable reactance circuit;
an amplifier, an output signal of which is positively fed back, having an output terminal which is connected to said resonator and said variable reactance circuit; and
a limiter circuit, connected to said output terminal of said amplifier, for attenuating an oscillation output having an absolute value larger than a predetermined level.

2. A voltage-controlled oscillator as claimed in claim 1, wherein aid limiter circuit comprises an upper limiter for limiting a level of the oscillation output when larger than a predetermined upper limit, and a lower limiter for limiting a level of the oscillation output when smaller than a predetermined lower limit.

3. A voltage-controlled oscillator comprising:
a resonator;
a variable reactance circuit;
an amplifier, an output signal of which is positively fed back, having an output terminal which is connected to said resonator and said variable reactance circuit; and
a limiter circuit, connected to said output terminal of said amplifier, for attenuating an oscillation output having an absolute value larger than a predetermined level, wherein said limiter circuit comprises a PNP type transistor having a base that is connected to a first power supply and an NPN type transistor having a base that is connected to a second power supply, and wherein emitters of said PNP type transistor and said NPN type transistor are commonly connected to said output terminal of said amplifier.

* * * * *

UNITED STATES PATENT AND TRADEMARK OFFICE
CERTIFICATE OF CORRECTION

PATENT NO. : 5,225,793
DATED : July 06, 1993
INVENTOR(S) : Naotoshi Higashiyama et al.

It is certified that error appears in the above-indentified patent and that said Letters Patent is hereby corrected as shown below:

Claim 2, column 4, line 21, change "aid" to --said--.

Signed and Sealed this

Fifth Day of April, 1994

BRUCE LEHMAN

Attest:

Attesting Officer

Commissioner of Patents and Trademarks